United States Patent
Watanabe

(10) Patent No.: US 6,902,852 B2
(45) Date of Patent: Jun. 7, 2005

(54) PATTERN TRANSFER METHOD USING A MASK AND HALF TONE MASK

(75) Inventor: Kunio Watanabe, Itano-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 96 days.

(21) Appl. No.: 10/260,532

(22) Filed: Oct. 1, 2002

(65) Prior Publication Data

US 2003/0064300 A1 Apr. 3, 2003

(30) Foreign Application Priority Data

Oct. 2, 2001 (JP) ............................... 2001-306951

(51) Int. Cl.[7] .............................. G03F 9/00; G03C 5/00
(52) U.S. Cl. ......................................... 430/5; 430/324
(58) Field of Search ........................... 430/5, 322, 324, 430/323

(56) References Cited

U.S. PATENT DOCUMENTS

| | | | |
|---|---|---|---|
| 5,700,606 A | | 12/1997 | Kobayashi et al. ............ 430/5 |
| 5,723,236 A | * | 3/1998 | Inoue et al. .................. 430/5 |
| 5,935,735 A | * | 8/1999 | Okubo et al. ................. 430/5 |
| 6,274,281 B1 | * | 8/2001 | Chen .......................... 430/5 |

FOREIGN PATENT DOCUMENTS

| | | |
|---|---|---|
| JP | 9-246149 A | 9/1997 |
| KR | 1998-068443 | 10/1998 |
| KR | 2000-0001481 | 1/2000 |

OTHER PUBLICATIONS

Korean Office Action mailed Oct. 19, 2004 (w/English translation thereof).

* cited by examiner

Primary Examiner—S. Rosasco
(74) Attorney, Agent, or Firm—Nixon & Vanderhye P.C.

(57) ABSTRACT

A half tone mask of the present invention is provided with a half tone film in which a thickness of the half tone film in a dense pattern area where optical proximity effect occurs differs from that in an isolated pattern area where the optical proximity effect does not occur, the thickness of the half tone film in the isolated pattern area being adjusted so that difference in size of a resist does not occur between the dense pattern area and the isolated pattern area due to the optical proximity effect, thus preventing the difference in size of the resist between the dense pattern area and the isolated pattern area, even when providing high definition patterns which causes the optical proximity effect.

18 Claims, 10 Drawing Sheets

FIG. 2 (a)
EB DRAWING
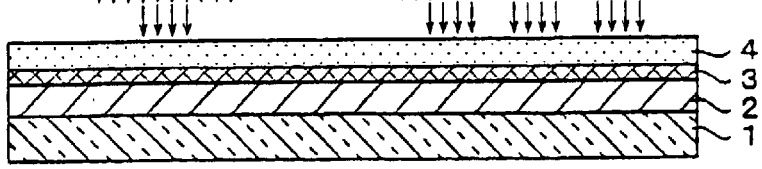
FIG. 2 (b)
DEVELOPMENT
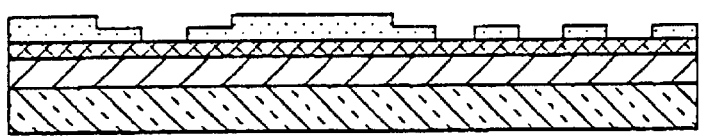
FIG. 2 (c)
ETCHING OF THE LIGHT BLOCKING FILM AND THE HALF TONE FILM
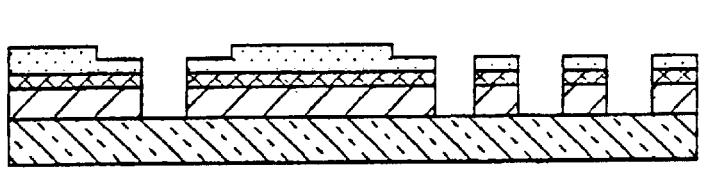
FIG. 2 (d)
ASHING
FIG. 2 (e)
ETCHING OF THE LIGHT BLOCKING FILM
FIG. 2 (f)
REMOVE THE RESIST
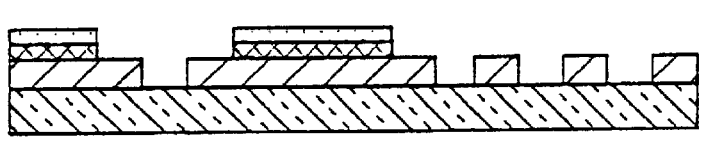
FIG. 2 (g)
APPLYING THE RESIST, EB DRAWING
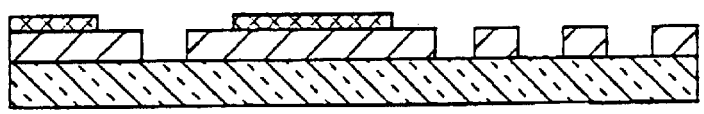
FIG. 2 (h)
DEVELOPMENT
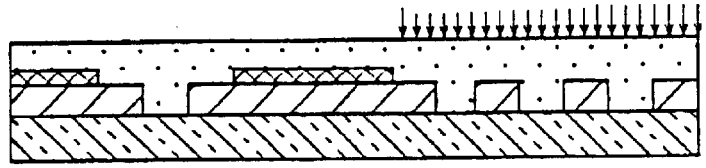
FIG. 2 (i)
ETCHING OF THE HALF TONE FILM
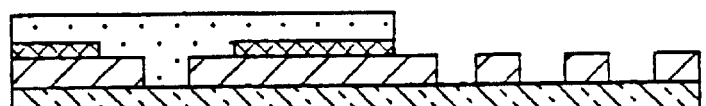
FIG. 2 (j)
REMOVE THE RESIST
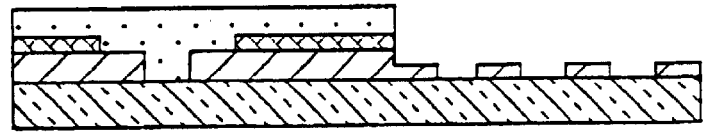

EB DRAWING

DEVELOPMENT

ETCHING OF THE HALF TONE FILM

REMOVE THE RESIST

APPLYING THE RESIST, EB DRAWING

DEVELOPMENT

ETCHING OF THE TRANSPARENT SUBSTRATE

REMOVE THE RESIST

FIG. 7 (a) (PRIOR ART)
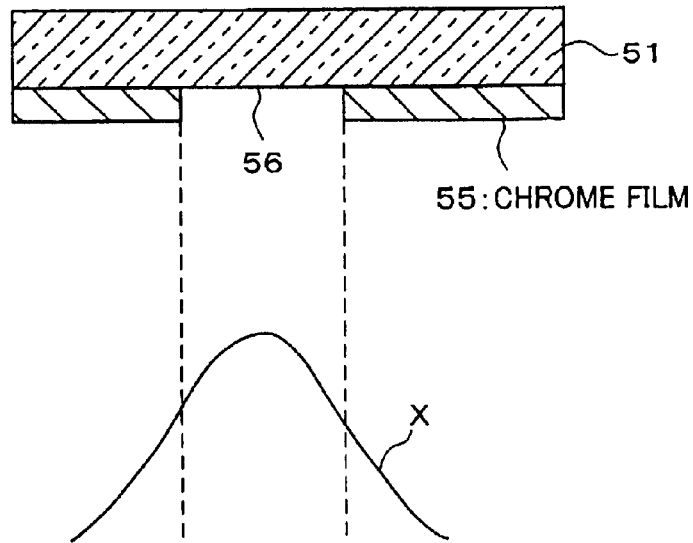
FIG. 7 (b) (PRIOR ART)
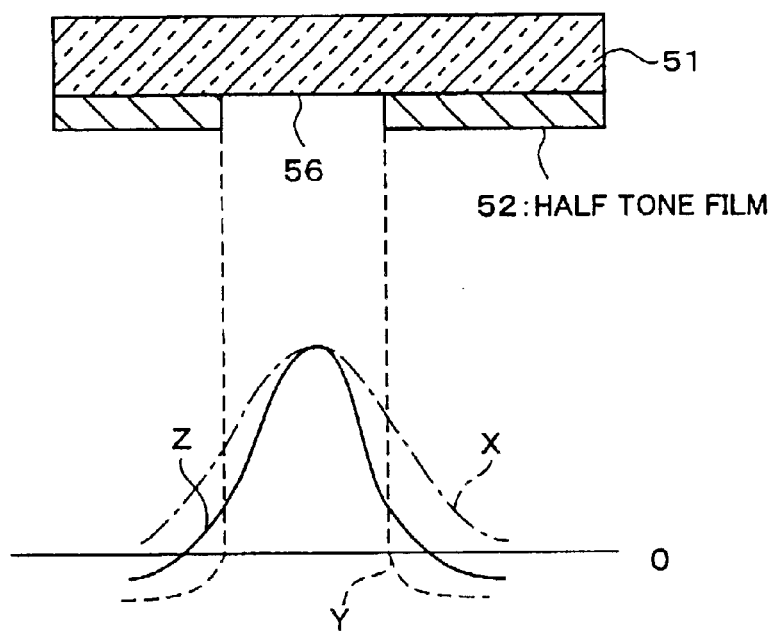

FIG. 8 (a) (PRIOR ART)
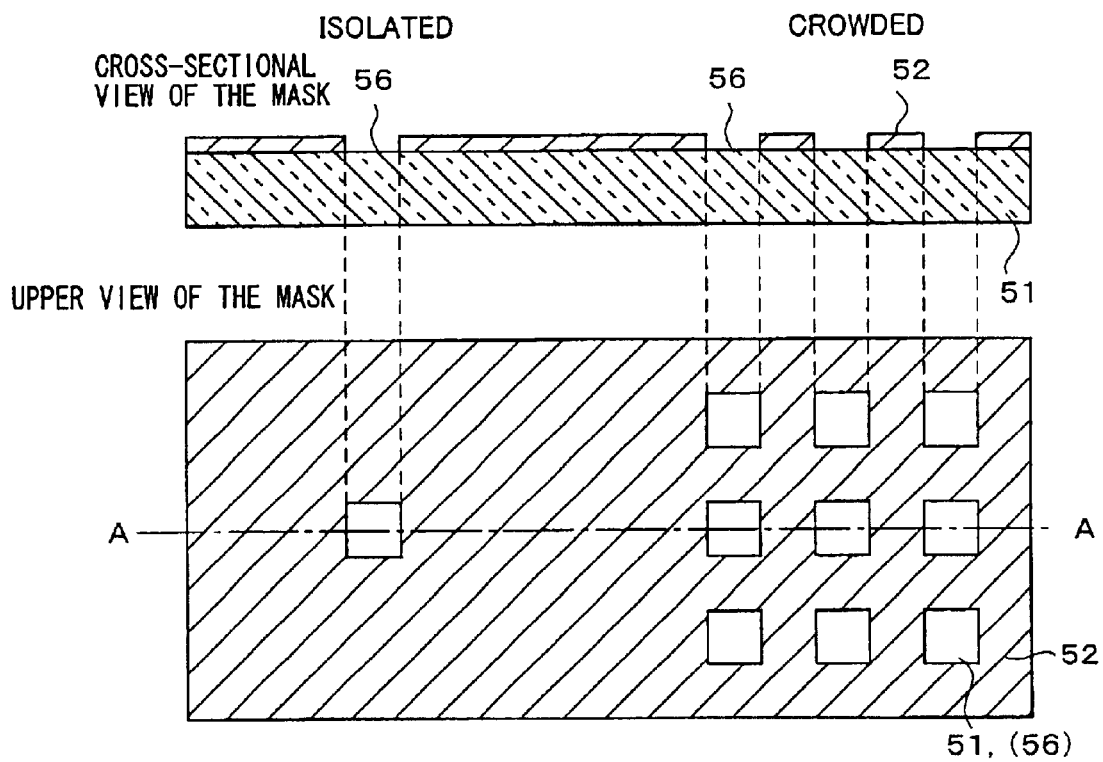
FIG. 8 (b) (PRIOR ART)
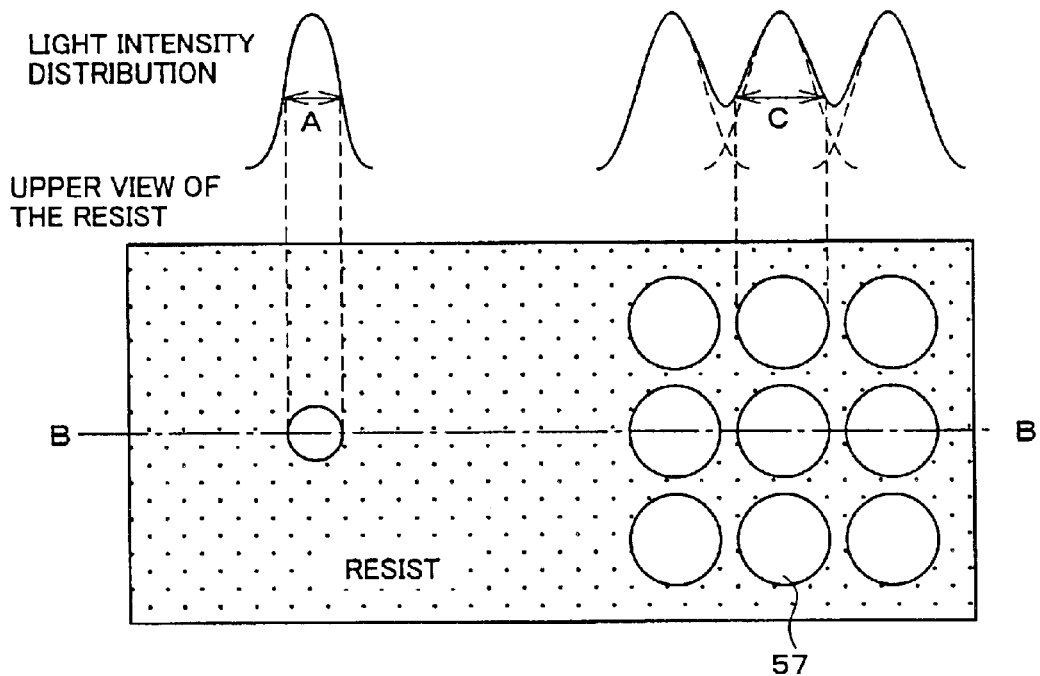

PATTERN TRANSFER METHOD USING A MASK AND HALF TONE MASK

FIELD OF THE INVENTION

The present invention relates to a pattern transfer method using a mask for optical lithography, half tone mask and a manufacturing method of the half tone mask, and a manufacturing method of a circuit board, which are suitably adopted for a manufacturing of a circuit board of such as an LSI (Large Scale Integrated Circuit).

BACKGROUND OF THE INVENTION

In recent years, remarkable progress of miniaturization of semiconductor devices has been made, and its processing rule has fallen under the realm of wavelength of light for exposure. With the progress, a new problem of the difference in size of the resist has arisen. The difference in size occurs between a dense pattern area having many gathered patterns, and an isolated pattern area having only one pattern, since optical proximity effect occurs in the dense pattern area and does not occur in the isolated pattern area. This difference in size of the resist degrades performance of the semiconductor devices, and further, it makes it more difficult to ensure high definition of resolution pattern and causes a problem to occur in larger-scale integrated circuit of semiconductor pattern. Note that, the optical proximity effect will be described in detail later.

Further, recently, a half tone mask has been created which uses a half tone film instead of a chrome film. The half tone film has a transmittancy of 1 to 25%, and provided with shifting function for shifting the phase of transmission light through the film to be off-phase by 180° from the phase of transmission light in a light transmission section (opening section). The half tone mask can provide a higher resolution compared to the case of adopting a chrome film. Japanese Unexamined Patent Publications Tokukaihei 8-328235 (published on Dec. 13, 1996), Tokukaihei 9-50116 (published on Feb. 18, 1997) and some other Japanese Patent publications disclose the half tone mask.

Here, the following will explain the difference between light for exposure when adopting a half tone mask, and light for exposure when adopting a conventional chrome mask.

As shown in FIG. 7(a), in the case of the chrome mask in which a chrome film 55 is formed on a transparent substrate 51, since the chrome film 55 is totally lightproof, light is only transmitted through an opening section 56 (light X) where the transparent substrate 51 is exposed.

On the other hand, as shown in FIG. 7(b), in the case of the half tone mask in which a half tone film 52 is formed on the transparent substrate 51, light is transmitted through the opening section 56 (light X) where the transparent substrate 51 is exposed, and also, a little quantity of light is transmitted through the half tone film 52 (light Y) by being adjusted its phase to be off-phase by 180° from that of the light transmitted through the opening section 56. The light Y has transmittancy of several %, and is in opposite phase of that of the light X. The light X and the light Y compose the light Z which is irradiated to a resist. Since the light Z is composed of the light X and light Y which are in opposite phases, the light Z (light for exposure) draws a sharp curve in a light intensity distribution, thereby providing a higher resolution compared to the case of adopting a chrome film shown in FIG. 7(a).

Note that, it is most effective that the phase of the transmission light through the half tone film 52 is adjusted to be off-phase by 180° from that of the light transmitted through the transparent substrate 51; however, resolution can be raised when it is adjusted to be within a range of 180°±10.

The following will explain a conventional half tone mask used for the manufacturing of a semiconductor device with reference to drawings.

FIG. 8(a) shows a conventional half tone mask. Note that, the cross-sectional view of the mask in FIG. 8(a) is taken along the line A—A in the upper view of the mask. As described above, the half tone mask has a structure in which a half tone film 52 is selectively formed on the transparent substrate 51. The transparent substrate 51 is normally made of quartz of 6 inches square having the thickness of 0.25 inch. The half tone film 52 is made of molybdenum silicide, and the thickness is adjusted to 90 to 110 nm so as to have an optical characteristic of 5 to 6% transmittancy. In FIG. 8(a), which is an upper view of the half tone mask, the area of transparent substrate 51 is a light transmission section (opening section) for transmitting light, and the area of half tone film 52 is a light blocking section.

When a pattern is transferred to a resist (photo resist) by using such a half tone mask with an exposure device, the optical proximity effect occurs in a dense pattern area. The optical proximity effect (shown in FIG. 8(b) is distortion of the light intensity distribution of adjacent transmission light in the dense pattern area which causes the difference in size of resist between the dense pattern area and the isolated pattern area and occurrences of roundness or over cutting of the edge of the pattern. This effect becomes more prominent with high definition pattern, and also, as the resist becomes thicker. Note that, the light intensity distribution in FIG. 8(b) is taken at the line B—B in the upper view of the mask.

When the optical proximity effect is occurred, the dense pattern area having many gathered patterns and the isolated pattern area having only one pattern become different to each other in size on the wafer, though these areas are the same in size on the mask. For example, in FIG. 8(b), the hole size of the created contact hole 57 varies in the dense pattern area and in the isolated pattern area even though the light transmission area, i.e., the opening sections 56 disposing the transparent substrate 51 are the same in size in both areas (refer to FIG. 8(a)). The hole size C in the dense pattern area is larger than the hole size A in the isolated pattern area.

FIG. 9 shows pitch dependence of the hole size in the dense pattern area, in the case where a pattern is transferred to a resist by using a conventional half tone mask with an exposure device of ArF laser (wavelength: 193 nm). In the figure, the opening section 56 of the conventional half tone mask is formed as a rectangle of 190 nm×190 nm. Further, FIG. 10 shows the mask pattern of the conventional half tone mask used for the measurement of the hole size, and further, FIG. 11 shows a light intensity distribution curve in the exposure at each pitch. In FIG. 10, W indicates the pitch of the opening section 56.

FIG. 9 revealed that the hole size gradually becomes larger as the pitch of the opening section 56 becomes at or smaller than 500 nm. This is because, as the pitch becomes smaller, the area of the half tone film 52 becomes narrower. This decreases phase shifting effect by the half tone film 52, and decreases resolution. The hole size becomes the largest when the pitch is 380 nm, and then, it starts to gradually become smaller as the pitch becomes further smaller. This is because, as shown in FIG. 11, the decrease of the phase shifting effect is saturated when the pitch becomes smaller than 380 nm, and now the maximum value of the intensity of the light for exposure starts to decrease.

As described, when the difference in size of the resist is occurred between the dense pattern area and the isolated pattern area due to the optical proximity effect during the manufacturing of the semiconductor device, the difference in size of the resist degrades performance of the semiconductor devices, and further, it makes it more difficult to ensure high definition of resolution pattern and causes a problem to realize a larger-scale integrated circuit of semiconductor pattern.

Japanese Patent Publication Tokukaihei 9-246149 (published on Sep. 19, 1997) teaches a technique for suppressing the transmittancy of the light for exposure in the dense pattern area, in order to correct the difference in size of the resist between the dense pattern area and the isolated pattern area due to the optical proximity effect.

The mask device disclosed in the publication above has an arrangement such that a circuit pattern is transferred to a chrome pattern on the upper surface of a transparent quarts substrate, and is equipped with a light quantity suppressing film in the dense chrome pattern area, where the wavelength of the light for exposure is at or 4 times of wiring pitch, for suppressing the transmittancy of the light for exposure. The light quantity suppressing film is provided either on a front surface or a rear surface of the quartz substrate. The light quantity suppressing film has a transmittancy of not less than 85% but less than 97% of the amplitude transmittancy of the light for exposure, and not less than 72% but less than 94% of the light intensity transmittancy of the light for exposure.

According to the publication, by having such a light quantity suppressing film, the light intensity in the area having dense layout patterns is suppressed, and also processing size variation due to the optical proximity effect can also be suppressed.

However, as with the mask device described in the foregoing publication, in the method of forming the light quantity suppressing film having transmittancy of 72% but less than 94% on the whole area of the dense pattern area, the exposure have to be performed in a longer period since light intensity of whole area decreases. Thus, it poses a problem of increasing the manufacturing cost.

SUMMARY OF THE INVENTION

An object of the present invention is to provide a half tone mask, and a pattern transfer method using the half tone mask, which can prevent the difference in size of a resist between a dense pattern area and an isolated pattern area due to optical proximity effect which occurs in the dense pattern area.

To attain the foregoing object, a pattern transfer method of the present invention, which uses a half tone mask having a function of shifting phase of transmission light so as to sharpen a curve of light intensity distribution in exposure, includes the step of:

softening the sharpness of the curve of the light intensity distribution in an isolated pattern area where optical proximity effect does not occur than that in a dense pattern area where the optical proximity effect occurs so that difference in size of a resist does not occur between the dense pattern area and the isolated pattern area due to the optical proximity effect, when both dense and isolated patterns are transferred to the resist.

Conventionally, in order to raise resolution, a half tone mask has a function of shifting the phase of the transmission light for making the sharpest curve in light intensity distribution. However, the optical proximity effect, which occurs in the dense pattern area, causes distortion of light intensity distribution curve in the exposure (transmission light through the mask), and the patterns formed on the resist in the dense pattern area becomes larger in size than the pattern in the isolated pattern area where no optical proximity effect occurs, though their opening sections are the same in size on the mask. The conventional half tone mask can raise resolution to be higher than that in the case of a chrome mask by making the sharpest curve in light intensity distribution, but the difference in size of the resist between the dense pattern area and the isolated pattern area degrades the performance of the device, and makes minimization of resolution pattern difficult. Thus, it causes a difficulty of realizing a larger-scale integrated semiconductor pattern.

To solve this problem, the present invention uses a phase shifting function of the half tone mask so as to soften the sharpness of the curve of the light intensity distribution in an isolated pattern area where optical proximity effect does not occur than that in a dense pattern area where the optical proximity effect occurs so that difference in size of a resist does not occur between the dense pattern area and the isolated pattern area due to the optical proximity effect, when both dense and isolated patterns are transferred to the resist.

With this method, the difference in size of the resist between the dense pattern area and the isolated pattern area can be prevented without decrease of light intensity which causes extra exposure period, though it is not possible to prevent occurrence of the expansion of the transferred patterns due to the optical proximity effect.

Further, with the combination of the conventional technique for reducing the optical proximity effect and the technique of the present invention can suppress the expansion of the transferred patterns due to the optical proximity effect, and also can suppress the difference in size of the resist between the dense pattern area and the isolated pattern area, thus effectively solving the various problems due to the optical proximity effect.

To make a gentler curve in light intensity distribution for the isolated pattern area where the optical proximity effect does not occur, compared to the curve for the dense pattern area where the optical proximity effect occurs, the phase difference between the transmission light through the film section where the half tone film is formed and the transmission light through the opening section where the transparent substrate is exposed is adjusted to be smaller in the isolated pattern area than the dense pattern area. The method for varying the phase difference may be a method of varying the thickness of the half tone film respectively in the dense area and the isolated area while providing the transparent substrate in the even thickness, or, in contrast, may be a method of varying the thickness (substrate thickness) of the transparent substrate respectively in the dense area and the isolated area while providing the half tone film in the even thickness.

To attain the foregoing object, a half tone mask of the present invention includes:

a half tone film formed on a transparent substrate for shifting phase of transmission light so as to sharpen a curve of light intensity distribution in exposure, wherein:

a phase difference between (i) transmission light through a film section where the half tone film is formed and (ii) transmission light through an opening section where the transparent substrate is exposed varies according to patterns transferred to a resist.

With this method, the phase difference between the transmission light through the film section where the half tone film is formed and the transmission light through the opening section where the transparent substrate is exposed are not even in the mask, and varies depending on the patterns transferred to the resist.

Thus, with the arrangement such that a phase difference between (i) transmission light through a film section where the half tone film is formed and (ii) transmission light through an opening section where the transparent substrate is exposed in a dense pattern area where optical proximity effect occurs differs from that in an isolated pattern area where the optical proximity effect does not occur, the phase difference in the isolated pattern area being adjusted so that difference in size of a resist does not occur due to the optical proximity effect, the difference in size of the resist due to the optical proximity effect between the dense pattern area and the isolated pattern area can be prevented without decrease of light intensity which causes extra exposure period.

Additional objects, features, and strengths of the present invention will be made clear by the description below. Further, the advantages of the present invention will be evident from the following explanation in reference to the drawings.

BRIEF DESCRIPTION OF THE DRAWINGS

FIGS. 2(a) through 2(j) are cross-sectional views showing each manufacturing step of a manufacturing method of the half tone mask of FIG. 1(a).

FIG. 7(a) is an explanatory view showing a chrome mask and light intensity distribution of transmission light through the chrome mask. FIG. 7(b) is an explanatory view showing a half tone mask and light intensity distribution of transmission light through the half tone mask.

FIG. 8(a) is a cross-sectional view and an upper view of a conventional half tone mask. FIG. 8(b) is an explanatory view showing light intensity distribution of light for exposure transmitted through the conventional half tone mask, and showing a result of transfer to a resist.

DESCRIPTION OF THE EMBODIMENTS

The present invention uses a half tone mask capable of shifting phase of transmission light so as to sharpen a curve of light intensity distribution in exposure, and soften the sharpness of the curve of the light intensity distribution in an isolated pattern area where optical proximity effect does not occur than that in a dense pattern area where the optical proximity effect occurs so that difference in size of a resist does not occur between the dense pattern area and the isolated pattern area due to the optical proximity effect, when both dense and isolated patterns are transferred to the resist at the same time.

More specifically, the exposure is carried out by using a half tone mask in which a phase difference between (i) transmission light through a film section where the half tone film is formed and (ii) transmission light through an opening section where the transparent substrate is exposed in a dense pattern area where optical proximity effect occurs differs from that in an isolated pattern area where the optical proximity effect does not occur, the phase difference in the isolated pattern area being adjusted so that difference in size of a resist does not occur due to the optical proximity effect.

As to the method for shifting the phase, a method for changing the thickness of the half tone film, or a method for changing the thickness of the exposed portion of the transparent substrate may be adopted. The following will respectively explain these methods with Embodiment 1 and Embodiment 2.

[Embodiment 1]

Figure 1:
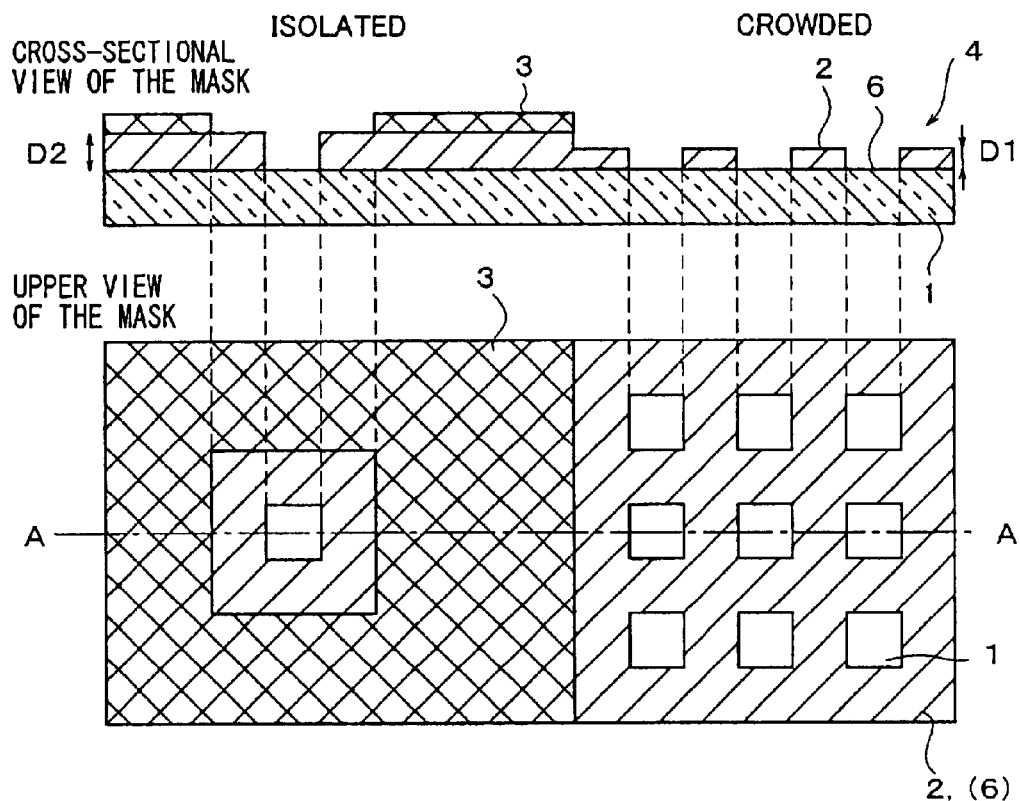
FIG. 1(a) is a cross-sectional view and an upper view of a half tone mask according to the present invention.
FIG. 1(b) is an explanatory view showing light intensity distribution of light for exposure, which is transmitted through the half tone mask, and showing a result of transfer to a resist.
Figure 1:
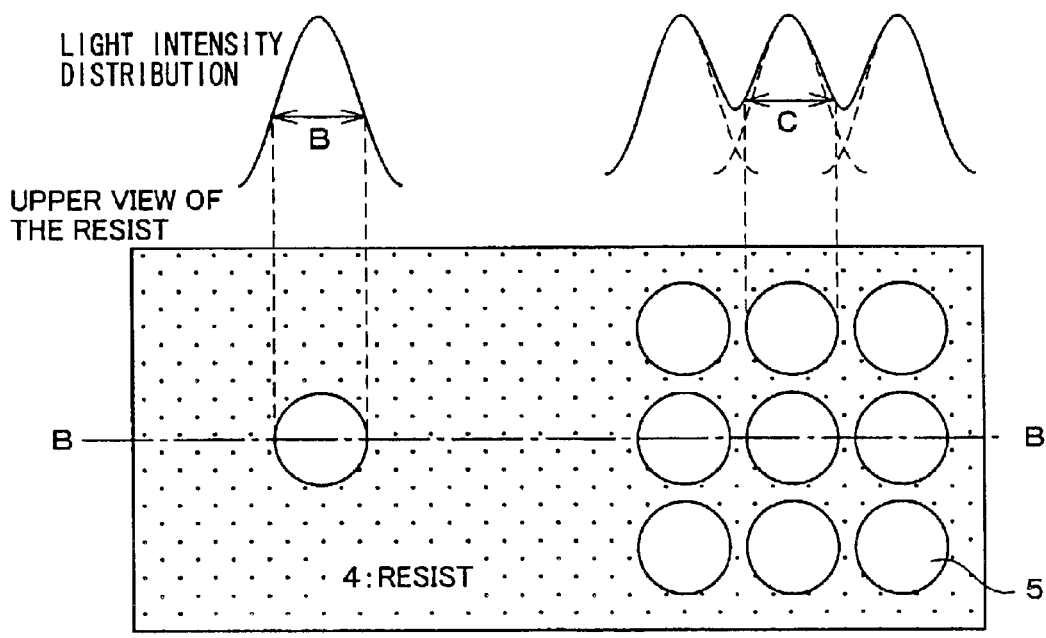

FIG. 1(a) is a cross-sectional view and an upper view of a half tone mask according to the present embodiment. FIG. 1(b) shows a state of light intensity distribution curve in the exposure, and the size of the contact hole formed on a resist, when exposure of the resist is performed by using the half tone mask of the present embodiment.

Note that, the cross-sectional view of the mask in FIG. 8(a) is taken along the line A—A in the upper view of the mask, and the light intensity distribution in FIG. 8(b) is taken at the line B—B in the upper view of the mask.

As shown in FIG. 1(a), the half tone mask of the present embodiment has a three-layers structure in which a half tone film 2 is selectively provided on a transparent substrate 1, and a light blocking film 3 is further formed on the half tone film 2.

The thickness of the half tone film 2 differs respectively in a dense pattern area (having dense patterns) and an isolated pattern area (having an isolated pattern). As shown in the figure, the thickness in the dense pattern area is formed to be the thickness denoted by D1, and the thickness in the isolated pattern area is formed to be the thickness denoted by D2.

The thickness D1 is adjusted so that the light transmitted through the film section where the half tone film 2 is formed having the thickness D1 is off-phase by 180° from that of the light transmitted through the opening section 6 where the transparent substrate is exposed, as with the conventional half tone film.

As explained with FIG. 7(b), when the light transmitted through the film section where the half tone film 2 is formed (film section) is off-phase by 180° from that of the light transmitted through the opening section 6 where the transparent substrate is exposed, the light intensity distribution curve in the exposure becomes the sharpest, and therefore resolution can be raised. Note that, most effective difference of the phases for this effect is 180°, which is totally opposite phases; however, the difference may be varied within a range of 180°±10.

The thickness D2 is adjusted to make the difference in phase between the light transmitted through the film section where the half tone film 2 is formed having the thickness D2 and the light transmitted through the opening section 6, so that the difference in size of the resist does not occur between the dense pattern area and the isolated pattern area due to optical proximity effect occurs in the dense pattern area.

The difference in phase caused by the thickness D2 reduces or prevents difference in size of a resist for a given pattern size from occurring, and may be numerically denoted by $(180+\alpha)°$ (Note that $-90 \leq \alpha \leq +90$, $\alpha \neq 0$). $\alpha$ indicates the variation from the phase difference of thickness D1 (=180°), which depends on the thickness of the half tone 2.

Figure 3:
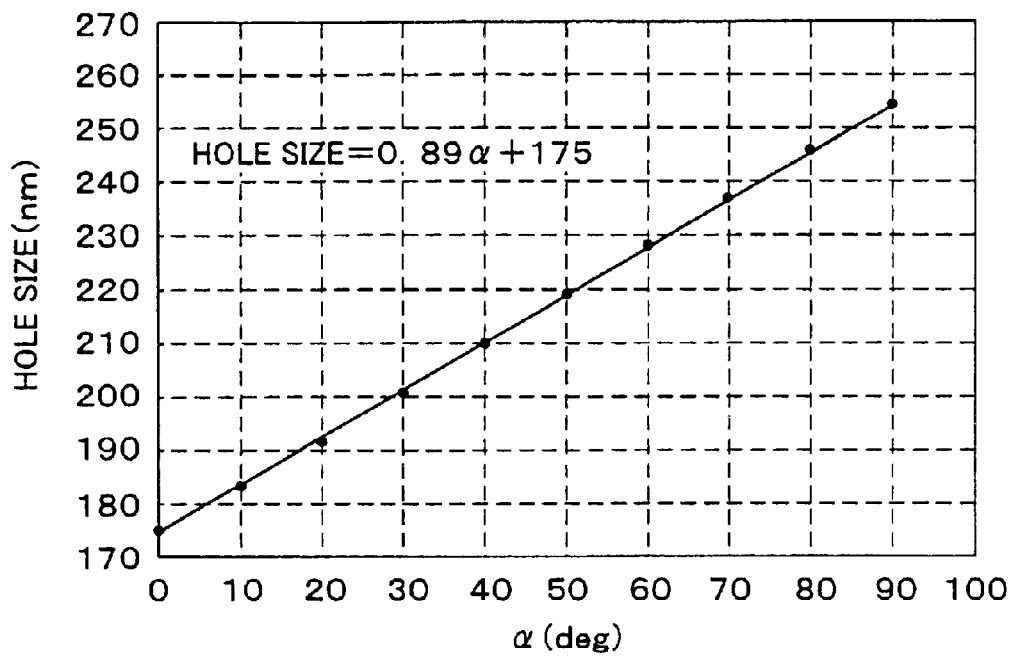
FIG. 3 is a graph showing the relation between the hole pattern size, and the phase difference in a dense pattern area, in the half tone mask according to one embodiment of the arrangement shown in FIG. 1(a).

FIG. 3 shows the relation between $\alpha$ and hole size of a pattern formed on the resist. Note that, this relation between $\alpha$ and hole size of a pattern is for a half tone mask described in Embodiment which will be described later. As the figure shows, the hole size is in proportion to $\alpha$ (an absolute value), i.e., the hole size becomes larger as $\alpha$ becomes greater. Namely, light intensity distribution becomes gentler as $\alpha$ becomes greater.

The present invention uses this behavior, when the transfer patterns in the dense area become larger than the one in the isolated area due to optical proximity effect, so as to intentionally change the size of exposure pattern in the isolated pattern area to follow the change of the ones in the dense pattern area by adjusting the value of $\alpha$.

Here, The thickness D1 and thickness D2 of the half tone film 2 are respectively denoted by the following equations, $$D1 = \lambda/2(n-1)$$

$$D2 = \lambda(1 + \alpha/180)/(n-1)$$

where:
$\lambda$ represents the wavelength of the light for exposure; and
n represents the refractive index of the material of the half tone film 2.

As the equations indicate, since the thickness D2 of the half tone film 2 in the isolated pattern area depends on $\alpha$, i.e., the variation from the phase difference of thickness D1 (=180°), the thickness D2 may be determined by the following manner: $\alpha$ is determined by finding out the value which can correct the difference in size of the resist occurs between the dense pattern area and the isolated pattern area with some experiments or simulations, and then the thickness D2 is adjusted to make the phase difference of $\alpha+180°$ for the transmission light.

Incidentally, by having different thickness between the isolated pattern area and the dense pattern area, the difference in level occurs at the border of the isolated pattern area and the dense pattern area, which may affect the thickness of the resist. In the half tone mask of the present invention, as thus mentioned, the light blocking film 3 is provided on the half tone mask 2 so as to prevent the unwanted effect. The light blocking film 3 is formed on an area, which is determined so as not to interfere the function for shifting the phase of the half tone film 2.

The material of the transparent substrate 1 has to have a high transmittancy with respect to the wavelength of an adopted light for exposure. For example, a synthetic quarts glass is suitable, as it has the transmittancy of not less than 90% at the wavelength of at or longer than 200 nm. The material of the half tone film 2 has to have a transmittancy, which does not cause a side lobe pattern at the wavelength when a pattern is transferred to a photo resist and can cause the maximum phase shifting effect. For example, the material has to have a transmittancy of 5 to 6% with respect to ArF laser. Accordingly, Molybdenum Silicide (MoSi), Zircon Suicide (ZrSi) or Tantalic Suicide (TaSi) is suitable.

The material of the light blocking film 3 has to have a low transmittancy with respect to the wavelength of an adopted light for exposure. For example, chrome is suitable, as it has the transmittancy of not more than 0.5% with respect to ArF laser.

By performing exposure of a mask pattern to a resist with an exposure device by using such a half tone mask, the difference in size of the transfer pattern can be prevented, which occurs between the dense pattern area and the isolated pattern area due to optical proximity effect.

For example, FIGS. 8(a) and 8(b) show the hole size when exposure is performed by using a conventional half tone mask. As shown in the figure, the hole size C in the dense pattern area is larger than the hole size A in the isolated pattern area. In contrast, when exposure is performed by using the half tone mask of the present embodiment, as shown in FIGS. 1(a) and 1(b), the hole size C in the dense pattern area is equal the hole size B in the isolated pattern area, as the light intensity distribution in the isolated pattern area is corrected to be the same as that in the dense pattern area, thus preventing the difference in size of the transfer pattern in the respective pattern areas. Note that, the reference numeral 5 indicates a hole formed on the resist 4.

The following will explain a manufacturing method of the described half tone mask with reference to FIG. 2.

Firstly, to create a blank mask, the half tone film 2 having the thickness D2 is formed on the transparent substrate 1 by such as sputtering or vacuum deposition, and the light blocking film 3 is formed on the half tone mask 2. Then, the blank mask is coated with resist (EB (Electron Beam) resist) 4 (The first step). Here, the resist 4 have to have superior etching resistance to perform etching for the half tone film 2 and the light blocking film 3.

Next, EB drawing is carried out on the resist 4 by applying electric beam, followed by the development, then, the resist 4 is patterned into three areas: a thick resist film area, a thin resist film area, and non resist area (FIGS. 2(a) and 2(b): The second step).

EB drawing process above does not performed on the area where the light blocking film 3 is exposed. Then, the first EB drawing is performed with respect to the area where the half tone film 2 is exposed, (only the first drawing). The quantity of electric charge for the single drawing have to be enough to create the desired thickness for the film obtained after the drawing, so as to prevent occurrence of resist pinhole during the etching for the light blocking film 3 and the half tone mask 2 (FIG. 2(c)), and also have to be enough to make the required difference in level between the thick resist film area and the thin resist film area. Here, the required difference in level refers to the thickness of the thick resist film area which can prevent the occurrence of pinhole during the etching for the light blocking film 3 (FIG. 2(e): described later) after removing the thin resist film area during an ashing process (FIG. 2(d): described later). However, adjusting the thick resist film area thicker than necessary in this process undesirably prolongs the ashing process. Then, the second EB drawing is performed with respect to the area (the opening section 6) where the transparent substrate is exposed, in addition to the first drawing, by applying electric beam again with an adjusted quantity of electric charge which is enough to completely remove the resist.

In the developing process above, when a posi resist is used as the resist 4, the resist is dissolved in developing solution in the area which had two (the first and the second) EB drawings, and the area becomes the non resist area where the light blocking film 3 is exposed. The area which had no EB drawings becomes the thick resist film area, as the resist is not dissolved in developing solution and remains its resist pattern in the same thickness. Further, in the area which had one (the first) EB drawing, the resist becomes thin, and the area becomes the thin resist film area.

Next, in the non resist area, the exposed light blocking film 3 and the half tone film 2 beneath the light blocking film 3 are completely removed by etching (FIG. 2(c): The third step).

In this process, dry etching is performed on the light blocking film 3 so as to expose the half tone film 2. Parallel plate reactive ion etching (RIE) is adopted for this dry etching for the light blocking film 3. When the light blocking film 3 is made of chrome, a combination of $CCl_4$ (tetra chloromethane) and $O_2$ (oxygen), or a combination of $CH_2Cl_2$ (dichloromethane) and $O_2$ (oxygen) is adopted as the etching gas with the flow ratio of 1:3. In the etching, a sufficient etching selectivity is required between the material of the light blocking film 3 and Molybdenum Silicide (MoSi), Zircon Silicide (ZrSi) or Tantalic Silicide (TaSi), which is the material of the half tone mask 2. Between the two combinations above used as the etching gas, the combination of $CH_2Cl_2$ (dichloromethane) and $O_2$ (oxygen) has a greater selectivity. Further, here, the resist 4 is used as a protection film against the etching, and therefore the light blocking film 3 is removed only in the area not protected by the resist 4, namely, the half tone film 2 is partly exposed. The use of chlorine gas for the dry etching of the chrome film can provide sufficient dry etching resistance to the resist 4.

Next, dry etching is performed on the exposed half tone film 2. The parallel plate reactive ion etching (RIE) is adopted for this dry etching for the half tone film 2. When the half tone film 2 is made of Molybdenum Silicide (MoSi), a combination of $CF_4$ (tetra fluoromethane) and $O_2$ (oxygen) is adopted as the etching gas with the flow ratio of 20:1. In the etching, a sufficient etching selectivity is required between the material of the half tone film 2 and the synthetic quartz glass, which is the material of the transparent substrate 1. Further, the resist 4 is again used as a protection film against the etching, and therefore the half tone film 2 is removed only in the area not protected by the resist 4, namely, the transparent substrate 1 is partly exposed. The use of tetra fluoromethane gas for the dry etching of Molybdenum Silicide (MoSi) can provide sufficient dry etching resistance to the resist 4.

After the etchings for the light blocking film 3 and the half tone film 2 beneath the light blocking film 3, the remaining resist 4 in the thin resist film area is removed by ashing so as to expose the light blocking film 3 beneath. Then, the exposed light blocking film 3 is completely removed by dry etching (FIGS. 2(d) and 2(e): The forth step).

In this ashing process, $O_2$ (oxygen) is adopted as the ashing gas with the flow of 100 sccm. When the light blocking film 3 is made of chrome, a combination of $CCl_4$ (tetra chloromethane) and $O_2$ (oxygen), or a combination of $CH_2Cl_2$ (dichloromethane) and $O_2$ (oxygen) is adopted as the etching gas with the flow ratio of 1:3. A sufficient etching selectivity is required between the material of the light blocking film 3 and the resist 4.

Next, the remaining resist 4 is completely removed, and thereafter, the resist 4 is applied again to coat the whole surface (FIGS. 2(f) and 2(g): The fifth step). Here, the resist 4 for the coating have to have superior etching resistance to perform etching for the half tone film 2.

Next, a patterning is carried out by EB drawing and a development so that the resist remains only in the isolated pattern area, and no resist is left (non resist area) in the dense pattern area (FIGS. 2(g) and 2(h): The sixth step).

In this process, EB drawings are not performed with respect to the isolated pattern area. Meanwhile, EB drawing is performed with respect to the dense pattern area by applying electric beam with an adjusted quantity of electric charge which is enough to completely remove the resist.

In the developing process, when a posi resist is used as the resist 4, in the dense pattern area which had EB drawing, the resist is dissolved in developing solution and the half tone film 2 is exposed. In the isolated pattern area which had no EB drawings, the resist remains, as it is not dissolved in developing solution.

Next, dry etching is performed on the exposed half tone film 2 by adjusting its thickness to be the thickness D1 (FIG. 2(i): The seventh step). Note that, this etching process for the half tone film 2 is performed under the same condition as that of the foregoing etching for the half tone film 2 which is described in the etching process for light blocking film and the half tone film (FIG. 2(c)).

Finally, the remaining resist 4 is completely removed (FIG. 2(j): The eighth step). Then, the half tone mask of the present embodiment, which is shown in FIG. 1(a), is completed.

FIG. 3, which has already been described, shows the relation between the variation α from the phase difference of 180° and the hole size of a pattern formed on the resist in the isolated pattern area, with respect to the half tone mask manufactured through the foregoing steps.

Figure 4:
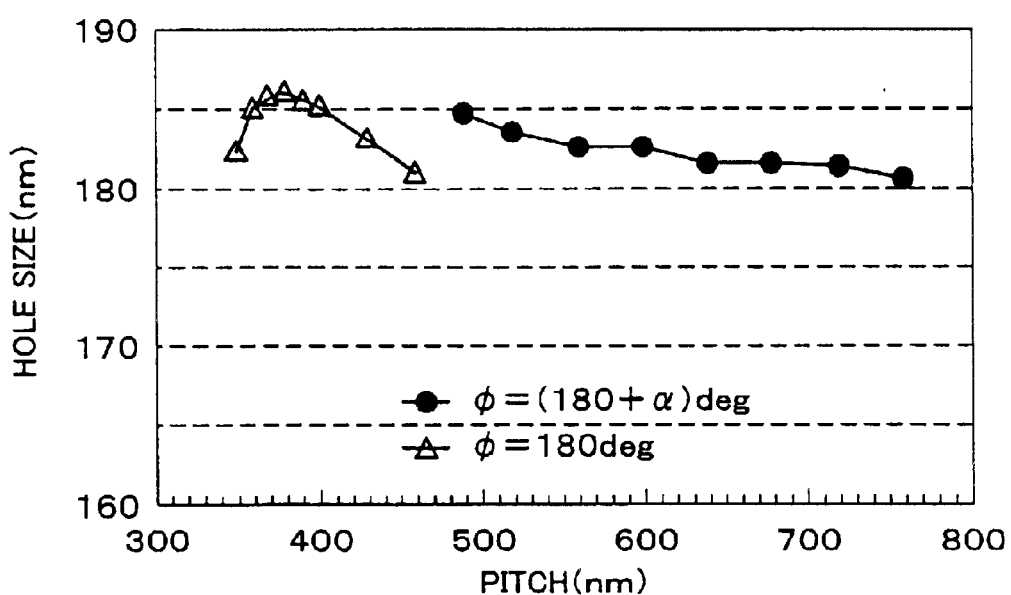
FIG. 4 is a graph showing the pitch size dependence of the hole pattern size in the half tone mask according to one embodiment of the arrangement shown in FIG. 1(a), when the phase difference (180°+α) in the isolated pattern area is adjusted to 187°.

Further, FIG. 4 shows pitch dependence of the hole size in the isolated pattern area in the half tone mask of the present embodiment, in the case where the phase deference $\phi (=(180+\alpha)$ deg) between the transmission light through the half tone film 2 and the transmission light through the opening section 6 is adjusted to 187 ($\alpha=7$).

Figure 9:
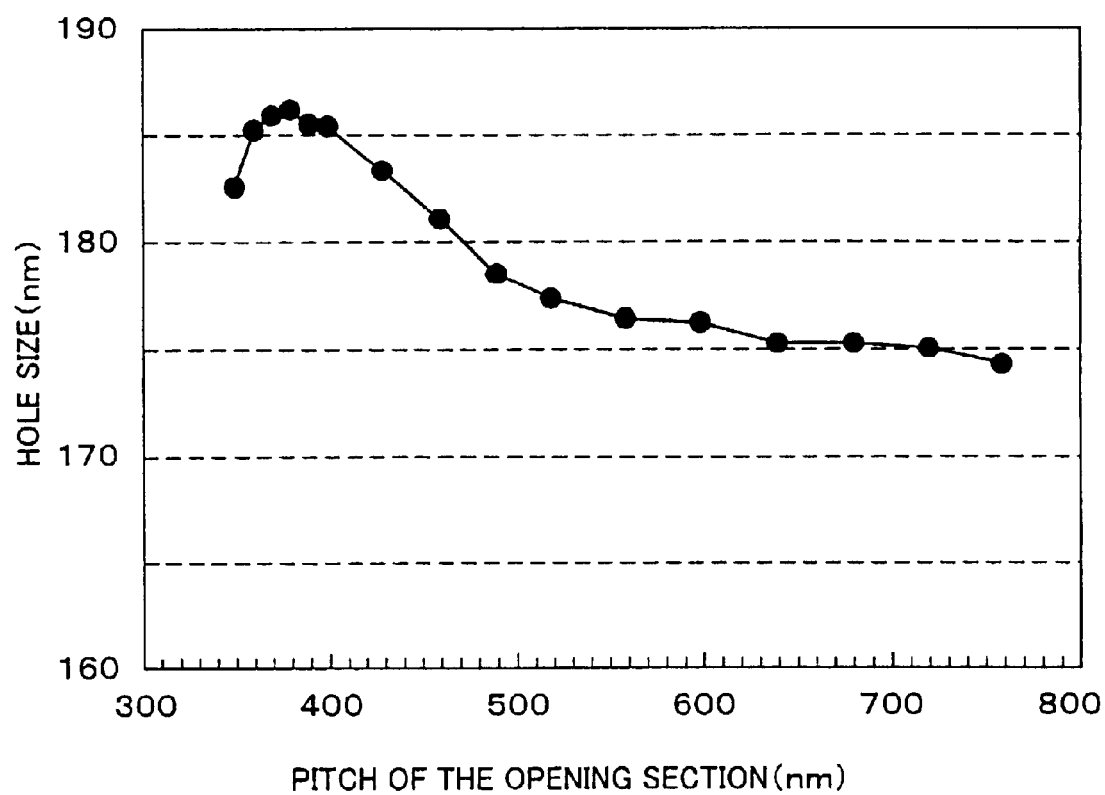
FIG. 9 is a graph showing pitch size dependence of the hole size in a conventional half tone mask.
Figure 10:
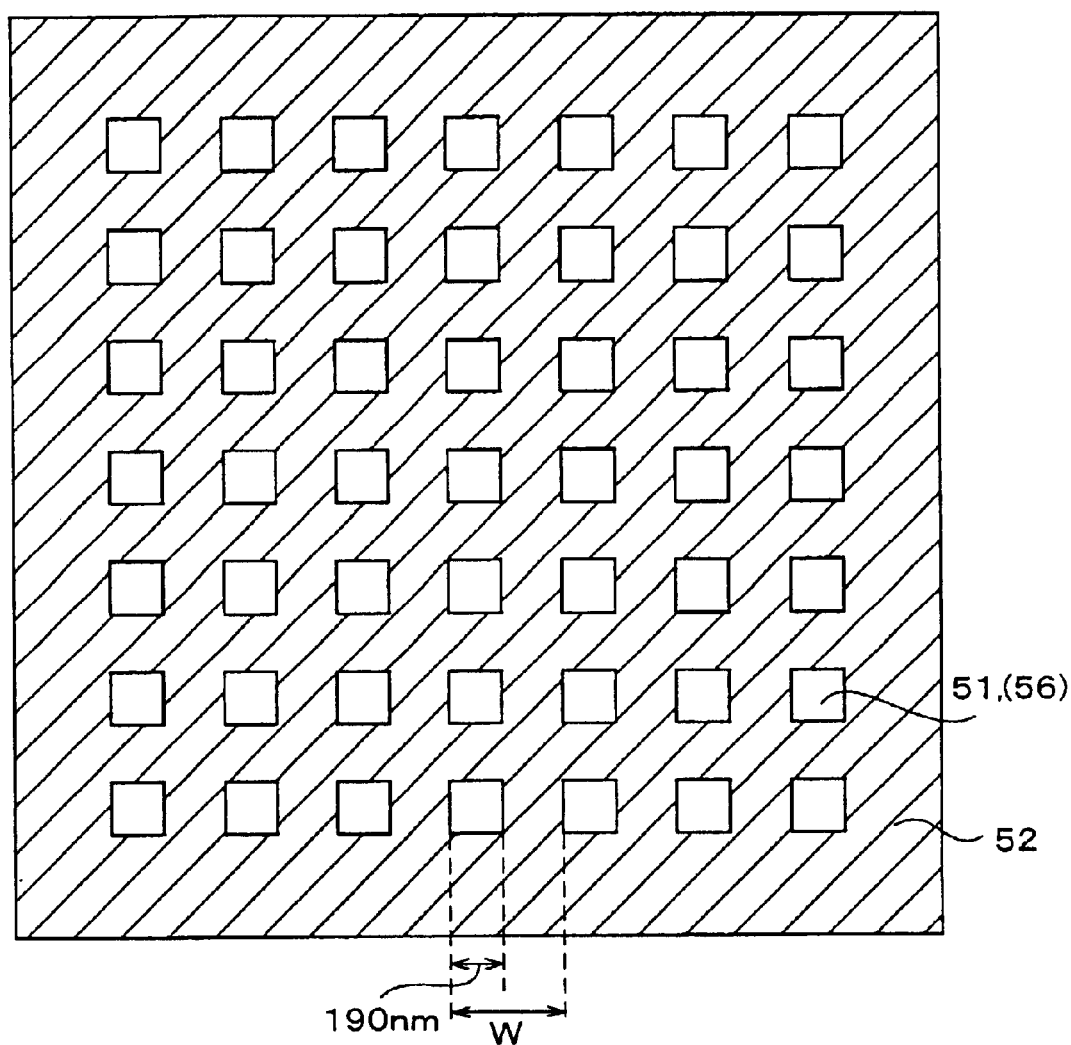
FIG. 10 is an upper view of the half tone mask used for the measurement of pitch size dependence of the hole size shown in FIG. 9.
Figure 11:
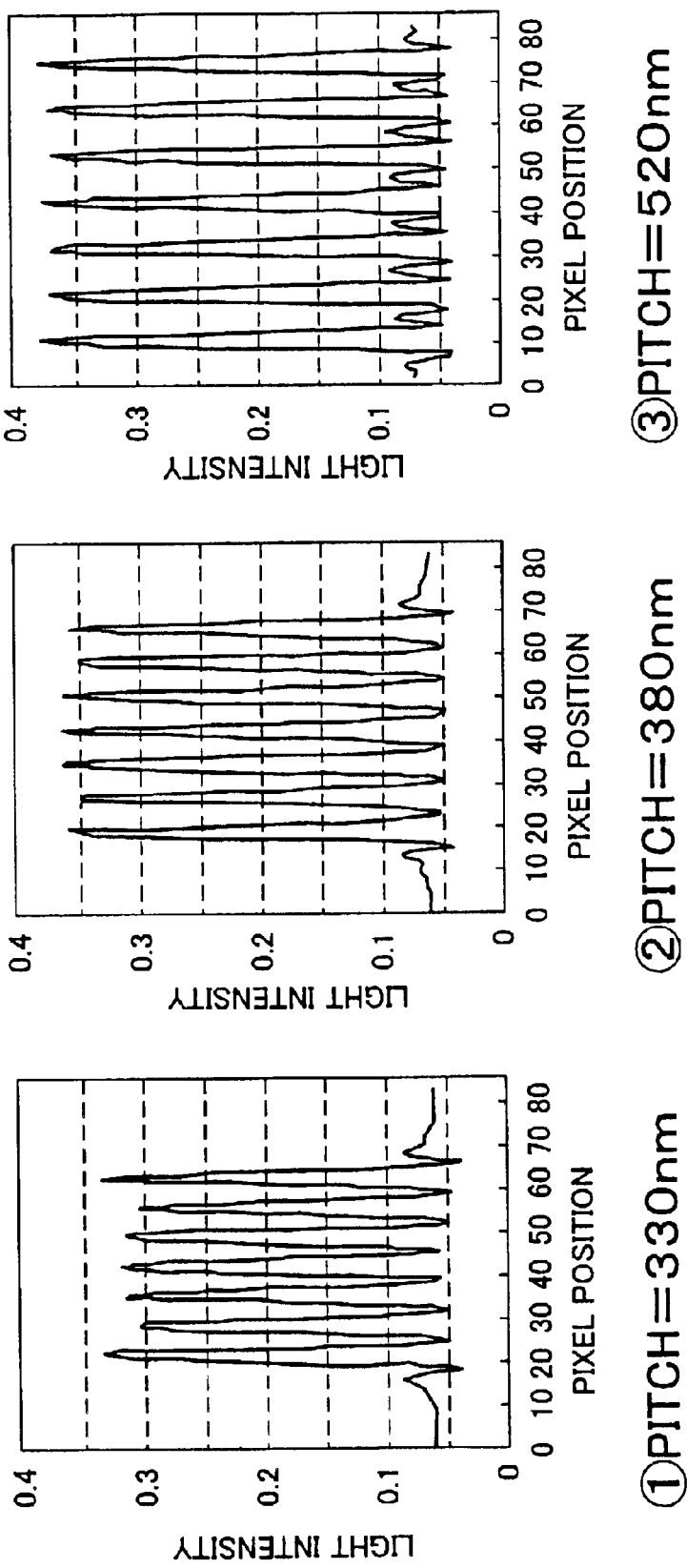
FIG. 11 is a graph showing pitch size dependence of light intensity distribution of light for exposure, in a conventional half tone mask.

As shown in the figure, by using the half tone mask of the present embodiment, the difference of the hole size is reduced to 6 nm, which was 12 nm for the conventional half tone mask (FIG. 9). Namely, it is possible to nearly halve the difference of the hole size with the half tone mask of the present embodiment.

[Embodiment 2]

FIG. 5(a) is a cross-sectional view and an upper view of a half tone mask according to another embodiment of the present invention. FIG. 5(b) shows a state of light intensity distribution curve in the exposure, and the size of the contact hole formed on a resist, when exposure of the resist is performed by using the half tone mask of the present embodiment.

Note that, the cross-sectional view of the mask in FIG. 8(a) is taken along the line A—A in the upper view of the mask, and the light intensity distribution in FIG. 8(b) is taken at the line B—B in the upper view of the mask.

Note that, for ease of explanation, materials having the equivalent functions as those shown in the drawings pertaining to Embodiment 1 above will be given the same reference symbols, and explanation thereof will be omitted here.

Figure 5:
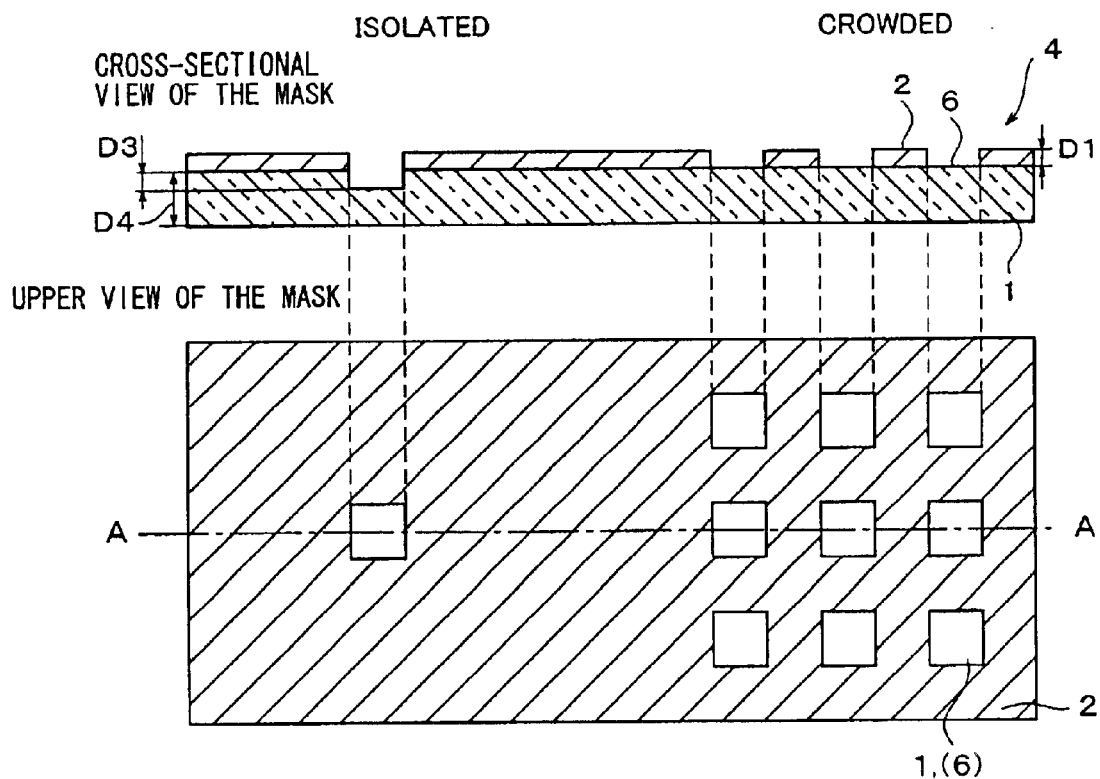
FIG. 5(a) is a cross-sectional view and an upper view of another half tone mask according to the present invention.
FIG. 5(b) is an explanatory view showing light intensity distribution of light for exposure, which is transmitted through the half tone mask of FIG. 5(a), and showing a result of transfer to a resist.
Figure 5:
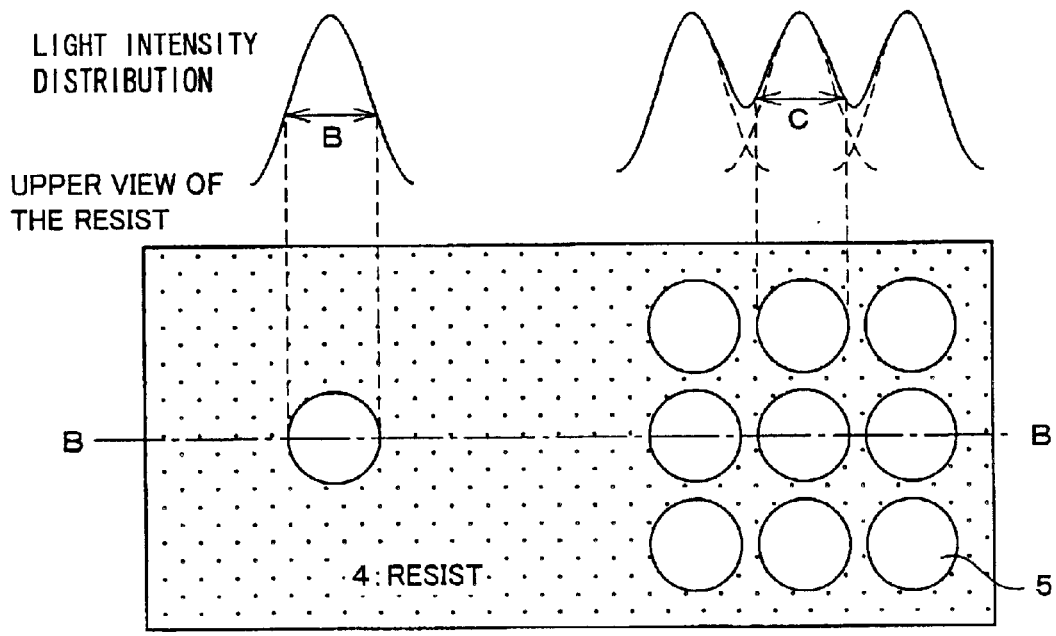

As shown in FIG. 5, in the half tone mask of the present embodiment, the thickness of the half tone film 2, which is selectively provided on the transparent substrate 1, is adjusted to be the same both in the dense pattern area and the isolated pattern area. However, the phase difference between the transmission light through the half tone film 2 and the transmission light through the opening section 6 is respectively varied in the dense pattern area and the isolated pattern area by digging a portion of the transparent substrate 1, which corresponds to the opening section 6 in the isolated pattern area.

The original thickness D4 of the transparent substrate 1 is adjusted to make the phase difference of 180° between the transmission light through the original thickness of the transparent substrate 1 and the transmission light through the half tone film 2 of the thickness D1. Meanwhile, the thickness of the dug portion of the transparent substrate 1 is adjusted to make the phase difference of 180°+α between the transmission light through the original thickness of the transparent substrate 1 and the transmission light through the half tone film 2 of the thickness D1. This phase difference of 180°+α is adjusted so that the difference in size of the resist does not occur between the dense pattern area and the isolated pattern area due to optical proximity effect occurs in the dense pattern area.

Here, the etching depth D3 of the transparent substrate 1 is denoted by the following equations, $$D3=\lambda(\alpha/180)/2(n'-1)$$

where:

variation α from the phase difference of 180° which can correct the difference in size of the resist in the isolated pattern area;

λ represents the wavelength of the light for exposure; and n' represents the refractive index of the material of the transparent substrate 1.

By performing exposure of a mask pattern to a resist with an exposure device by using such a half tone mask, the difference in size of the transfer pattern can be prevented, which occurs between the dense pattern area and the isolated pattern area due to optical proximity effect.

For example, FIGS. 8(a) and 8(b) show the hole size when exposure is performed by using a conventional half tone mask. As shown in the figure, the hole size C in the dense pattern area is larger than the hole size A in the isolated pattern area. In contrast, when exposure is performed by using the half tone mask of the present embodiment, as shown in FIGS. 5(a) and 1(b), the hole size C in the dense pattern area is equal the hole size B in the isolated pattern area, as the light intensity distribution in the isolated pattern area is corrected to be the same as that in the dense pattern area, thus preventing the difference in size of the transfer pattern in the respective pattern areas.

The following will explain a manufacturing method of the described half tone mask with reference to FIG. 6.

Firstly, to create a blank mask, the half tone film 2 having the thickness D1 is formed on the transparent substrate 1 by such as sputtering or vacuum deposition. Then, the blank mask is coated with resist (EB (Electron Beam) resist) 4 (The step A). Here, the resist 4 have to have superior etching resistance to perform etching for the half tone film 2.

Figure 6A:
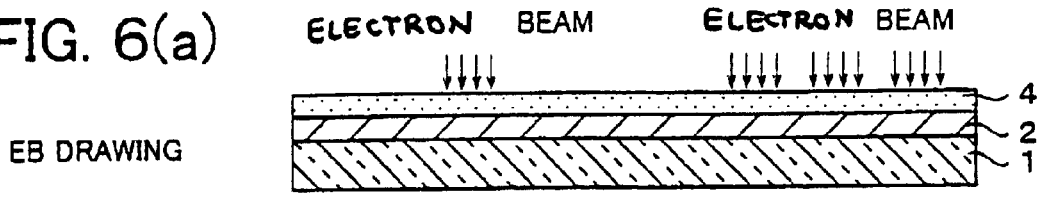
FIGS. 6(a) through 6(h) are cross-sectional views showing each manufacturing step of a manufacturing method of the half tone mask of FIG. 5(a).
Figure 6B:

Next, EB drawing is carried out on the resist 4 by applying electric beam, followed by the development, then, the resist 4 is patterned (FIGS. 6(a) and 2(b): The step B).

EB drawing process above does not performed on the area where the half tone film 2 is exposed. Then, the EB drawing is performed with respect to the area (the opening section 6) where the transparent substrate is exposed by applying electric beam with an adjusted quantity of electric charge which is enough to completely remove the resist.

In the developing process above, when a posi resist is used as the resist 4, the resist is dissolved in developing solution in the area which had EB drawing, and the area becomes the non resist area where the half tone film 2 is exposed. In the area which had no EB drawings, the resist is not dissolved in developing solution and remains its resist pattern in the same thickness.

Figure 6C:

Next, in the non resist area, the exposed half tone film 2 is completely removed by etching (FIG. 6(c): The step C).

Parallel plate reactive ion etching (RIE) is adopted for the dry etching. When the half tone film 2 is made of Molybdenum Silicide (MoSi), a combination of $CF_4$ (tetra fluoromethane) and $O_2$ (oxygen) is adopted as the etching gas with the flow ratio of 20:1. In the etching, a sufficient etching selectivity is required between the material of the half tone film 2 and the synthetic quartz glass, which is the material of the transparent substrate 1. Further, the resist 4 is again used as a protection film against the etching, and therefore the half tone film 2 is removed only in the area not protected by the resist 4, namely, the transparent substrate 1 is partly exposed. The use of tetra fluoromethane gas for the dry etching of Molybdenum Silicide (MoSi) can provide sufficient dry etching resistance to the resist 4.

Figure 6D:

Next, after the etching for the half tone film 2, the remaining resist 4 in the thin resist area is completely removed, and thereafter, the resist 4 is applied again to coat the whole surface (FIGS. 6(d) and 2(e): The step D). Here, the resist 4 for the coating have to have superior etching resistance to perform etching for the half tone film 2.

Figure 6E:
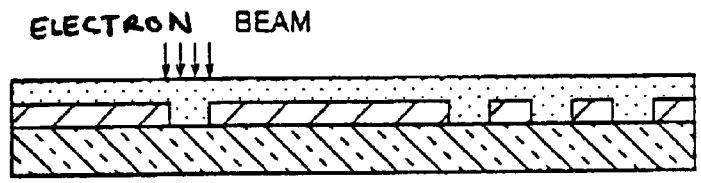
Figure 6F:
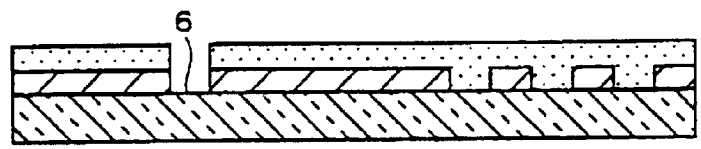

Next, the resist is patterned by EB drawing and a development (FIGS. 6(e) and 6(f): The step E).

In this process, EB drawing is performed with respect to the isolated pattern area, which will be the opening section 6, where the transparent substrate is exposed by applying electric beam with an adjusted quantity of electric charge which is enough to completely remove the resist. For the rest of the area, no EB drawings are performed.

In the developing process, when a posi resist is used as the resist 4, in the dense pattern area which had EB drawing, the resist is dissolved in developing solution and the transparent substrate 1 is exposed. In the area which had no EB drawings, the resist remains, as it is not dissolved in developing solution.

Figure 6G:
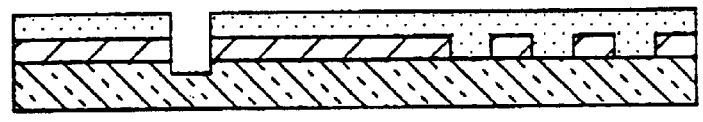

Next, dry etching is performed on the exposed transparent substrate 1 by making the dug portion which is adjusted to be the thickness D3 (FIG. 6(g): The step F).

Parallel plate reactive ion etching (RIE) is adopted for the dry etching. When transparent substrate 1 is made of synthetic quartz glass, a combination of $CF_4$ (tetra fluoromethane) and $O_2$ (oxygen) is adopted as the etching gas with the flow ratio of 2:1. To ensure a high etching rate, low RF power of at or lower than 40 W and high degree of vacuum of at or lower than 5.0 Pa is adopted. Here, the resist 4 is used as a protection film against the etching, and therefore the transparent substrate 1 is dug only in the opening section 6 which is not protected by the resist 4. The use of $CF_4$ (tetra fluoromethane) for the dry etching of synthetic quartz glass can provide sufficient dry etching resistance to the resist 4.

Figure 6H:

Finally, the remaining resist 4 is completely removed (FIG. 6(h): The step G). Then, the half tone mask of the present embodiment, which is shown in FIG. 5(a), is completed.

As described, a pattern transfer method of the present invention, which uses a half tone mask having a function of shifting phase of transmission light so as to sharpen a curve of light intensity distribution in exposure, includes the step of:

softening the sharpness of the curve of the light intensity distribution in an isolated pattern area where optical proximity effect does not occur than that in a dense pattern area where the optical proximity effect occurs so that difference in size of a resist does not occur between the dense pattern area and the isolated pattern area due to the optical proximity effect, when both dense and isolated patterns are transferred to the resist at the same time.

Further, a half tone mask of the present invention is a half tone mask includes:

a half tone film formed on a transparent substrate for shifting phase of transmission light so as to sharpen a curve of light intensity distribution in exposure, wherein:

a phase difference between (i) transmission light through a film section where the half tone film is formed and (ii) transmission light through an opening section where the transparent substrate is exposed varies according to patterns transferred to a resist.

Further, the half tone mask of the present invention is a half tone mask, includes:

a half tone film formed on a transparent substrate for shifting phase of transmission light so as to sharpen a curve of light intensity distribution in exposure, wherein:

a phase difference between (i) transmission light through a film section where the half tone film is formed and (ii) transmission light through an opening section where the transparent substrate is exposed in a dense pattern area where optical proximity effect occurs differs from that in an isolated pattern area where the optical proximity effect does not occur, the phase difference in the isolated pattern area being adjusted so that difference in size of a resist does not occur due to the optical proximity effect.

Further, the half tone mask of the present invention is a half tone mask, includes:

a half tone film formed on a transparent substrate for shifting phase of transmission light so as to sharpen a curve of light intensity distribution in exposure, wherein:

a thickness of the half tone film in a dense pattern area where optical proximity effect occurs differs from that in an isolated pattern area where the optical proximity effect does not occur, the thickness of the half tone film in the isolated pattern area being adjusted so that difference in size of a resist does not occur between the dense pattern area and the isolated pattern area due to the optical proximity effect.

This is a concrete arrangement for realizing the method in which the phase difference between the transmission light through the film section where the half tone film is formed and the transmission light through the opening section where the transparent substrate is exposed is adjusted to the different values respectively in the dense pattern area where the optical proximity effect occurs and the isolated pattern area where the optical proximity effect does not occur, so that the difference in size of the resist does not occur between the dense pattern area and the isolated pattern area due to optical proximity effect.

The phase difference between the transmission light through the film section where the half tone film is formed and the transmission light through the opening section where the transparent substrate is exposed may vary by either varying the phase of the transmission light through the film section where the half tone film is formed or varying the phase of transmission light through the opening section. Accordingly, the thickness of the half tone film is varied respectively in the dense pattern area where the optical proximity effect occurs and the isolated pattern area where the optical proximity effect does not occur, so that the difference in size of the resist does not occur between the dense pattern area and the isolated pattern area due to optical proximity effect.

Therefore, as thus described, the half tone mask capable of preventing the difference in size of the resist between the dense pattern area and the isolated pattern area due to the optical proximity effect without decrease of light intensity which causes extra exposure period can easily be realized.

In this half tone mask having a half tone film whose thickness respectively differs between the dense pattern area and the isolated pattern area, a light blocking film is formed on an area not affecting a phase shifting function on the half tone film.

This is to prevent the unwanted effect to the resist due to the difference in level which occurs at the border of the isolated pattern area and the dense pattern area by having the different thickness between the isolated pattern area and the dense pattern area. As described, the light blocking film is provided on the half tone mask, thus preventing the unwanted effect.

A half tone mask of the present invention, includes:

a half tone film formed on a transparent substrate for shifting phase of transmission light so as to sharpen a curve of light intensity distribution in exposure, wherein:

a thickness of an opening section where the transparent substrate is exposed in a dense pattern area where optical proximity effect occurs differs from that in an isolated pattern area where the optical proximity effect does not occur, the thickness of the opening section where the transparent substrate is exposed in the isolated pattern area being adjusted so that difference in size of a resist does not occur between the dense pattern area and the isolated pattern area due to the optical proximity effect.

This is a concrete arrangement for realizing the method in which the phase difference between the transmission light through the film section where the half tone film is formed and the transmission light through the opening section where the transparent substrate is exposed is adjusted to the different values respectively in the dense pattern area where the optical proximity effect occurs and the isolated pattern area where the optical proximity effect does not occur, so that the difference in size of the resist does not occur between the dense pattern area and the isolated pattern area due to optical proximity effect.

The phase difference between the transmission light through the film section where the half tone film is formed and the transmission light through the opening section where the transparent substrate is exposed may vary by either varying the phase of the transmission light through the film section where the half tone film is formed or varying the phase of transmission light through the opening section. Accordingly, the thickness of the portion where the transparent substrate is exposed is varied respectively in the dense pattern area where the optical proximity effect occurs and the isolated pattern area where the optical proximity effect does not occur, so that the difference in size of the resist does not occur between the dense pattern area and the isolated pattern area due to optical proximity effect occurs in the dense pattern area.

Therefore, as thus described, the half tone mask capable of preventing the difference in size of the resist between the dense pattern area and the isolated pattern area due to the optical proximity effect without decrease of light intensity which causes extra exposure period can easily be realized.

Further, in each of the described half tone mask, it is preferable that the half tone film is made of Molybdenum Silicide, Zircon Silicide or Tantalic Silicide.

Molybdenum Silicide, Zircon Silicide or Tantalic Silicide is suitable for the material of the half tone film since it has a transmittancy which does not cause a side lobe pattern at the wavelength of the adopted light for exposure when a pattern is transferred to a photo resist, and also can cause the maximum phase shifting effect.

Further, a manufacturing method of a circuit board of the present invention includes the step of transferring a layout of the circuit board by using the foregoing half tone mask.

As has been described, since the half tone mask of the present invention can prevent the difference in size of the resist between the dense pattern area and the isolated pattern area due to the optical proximity effect without decrease of light intensity which causes extra exposure period, performance of the device will be improved by being equipped with a circuit board including this half tone mask. Further, it ensures high definition of resolution pattern, thus realizing a larger-scale integrated circuit of the semiconductor pattern.

A manufacturing method of a circuit board of the present invention includes the steps of:

(1) applying a resist to coat a blank mask in which a half tone film having a first film thickness is formed on a transparent substrate, and a light blocking film is formed on the half tone film;

(2) patterning the resist thus applied in the step (1) by exposure and development into a thick film area in which the light blocking film is to be exposed, a thin film area in which the half tone film is to be exposed, and a non resist area in which the transparent substrate is to be exposed, respectively;

(3) completely removing the light blocking film and the half tone film beneath thus exposed in the step (2) by etching;

(4) removing the resist in the thin film area thus patterned in the step (2) by ashing, and completely removing the light blocking film formed beneath the thin film area by etching, after the step (3);

(5) completely removing the remaining resist, and then applying a resist again, after the step (4);

(6) patterning the resist thus applied in the step (5) by exposure and development so that a dense pattern area where optical proximity effect occurs has no resist;

(7) carrying out etching for the half tone film thus exposed in the step (6) to have a second film thickness; and (8) removing the remaining resist, wherein:

the first film thickness causes a phase difference between (i) transmission light through a film section where the half tone film is formed and (ii) transmission light through an opening section where the transparent substrate is exposed so that difference in size of the resist does not occur between a dense pattern area and an isolated pattern area, and the second film thickness causes a phase difference of about 180° between the (i) transmission light through the film section where the half tone film is formed and the (ii) transmission light through the opening section where the transparent substrate is exposed.

By manufacturing the half tone mask in this manner, the half tone mask of the present invention having a half tone film whose thickness respectively differs in the dense pattern area and the isolated pattern area can easily be obtained.

A manufacturing method of a circuit board of the present invention includes the steps of:

(A) applying a resist to coat a blank mask in which a half tone film having a predetermined thickness is formed on a transparent substrate having a first substrate thickness;

(B) patterning the resist thus applied in the step (A) by exposure and development so that an area where the transparent substrate is exposed has no resist;

(C) completely removing the half tone film thus exposed in the step (B) by etching;

(D) completely removing the remaining resist, and then applying a resist again, after the step (C);

(E) patterning the resist thus applied in the step (D) by exposure and development so that an isolated pattern area where optical proximity effect does not occur has no resist;

(F) digging the transparent substrate thus exposed in the step (E) to have a second substrate thickness; and (G) removing the remaining resist, wherein:

the first substrate thickness causes a phase difference of about 180° between (i) transmission light through an opening section where the transparent substrate is exposed having the first substrate thickness and (ii) transmission light through a film section where the half tone film is formed, and the second substrate thickness causes a phase difference between (iii) transmission light through the opening section where the transparent substrate in exposed having the second substrate thickness and the (ii) transmission light through the film section where the half tone film is formed, so that difference in size of the resist does not occur between a dense pattern area and an isolated pattern area.

By manufacturing the half tone mask in this manner, the half tone mask of the present invention having a transparent substrate whose thickness respectively differ in the dense pattern area and the isolated pattern area can easily be obtained.

Further, the half tone mask of the present invention includes a light blocking film, a half tone film and a transparent substrate may have an arrangement such that the thickness of the half tone film is varied respectively in the dense pattern area where the optical proximity effect occurs and the isolated pattern area where the optical proximity effect does not occur, and the half tone film is made of Molybdenum Silicide, Zircon Silicide or Tantalic Silicide, and further, the phase difference between the half tone film and the transparent substrate is adjusted to 180±10° in the dense pattern area, and in the isolated pattern area, it is adjusted to ±90° with respect to the phase difference in the dense pattern area.

Further, the half tone mask of the present invention includes a half tone film and a transparent substrate may have an arrangement such that the thickness of the portion where the transparent substrate is exposed is varied respectively in the dense pattern area where the optical proximity effect occurs and the isolated pattern area where the optical proximity effect does not occur, and the half tone film is made of Molybdenum Silicide, Zircon Silicide or Tantalic Silicide, and further, the phase difference between the half tone film and the transparent substrate is adjusted to 180±10° in the dense pattern area, and in the isolated pattern area, it is adjusted to ±90° with respect to the phase difference in the dense pattern area.

Further, a manufacturing method of a half tone mask of the present invention may include the steps of:

(1) applying an EB (Electric Beam) drawing resist to coat a blank mask in which a half tone film is formed on a transparent substrate, and a light blocking film is formed on the half tone film;

(2) patterning the resist thus applied in the step (1) by exposure and development into a thick film area, a thin film area, and a non resist area, respectively;

(3) carrying out etching for the light blocking film in the non resist area and also for the half tone film beneath thus exposed in the step (2);

(4) removing the resist in the thin film area thus patterned in the step (2) by ashing, and completely removing the light blocking film formed beneath the thin film area by etching;

(5) completely removing the remaining resist, and then applying a resist again,;

(6) patterning the resist thus applied in the step (5) by exposure and development so that a dense pattern area where optical proximity effect occurs has no resist;

(7) carrying out etching for the half tone film thus exposed in the step (6) to have a second film thickness which causes a phase difference of about 180° between the (i) transmission light through the film section where the half tone film is formed and the (ii) transmission light through the opening section where the transparent substrate is exposed; and (8) removing the remaining resist.

Further, a manufacturing method of a half tone mask of the present invention may include the steps of:

(A) applying an EB drawing resist to coat a blank mask in which a half tone film is formed on a transparent substrate;

(B) patterning the resist thus applied in the step (A) by exposure and development;

(C) completely removing the half tone film thus exposed in the step (B) by etching;

(D) completely removing the remaining resist, and then applying a resist again, after the step (C);

(E) patterning the resist thus applied in the step (D) by exposure and development;

(F) digging a portion the transparent substrate thus exposed in the step (E), which is adjacent to the phase shifting function; and (G) removing the remaining resist.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A pattern transfer method using a half tone mask having a function of shifting phase of transmission light so as to sharpen a curve of light intensity distribution in exposure, comprising:

softening the sharpness of the curve of the light intensity distribution in an isolated pattern area where optical proximity effect substantially does not occur compared to that in a dense pattern area where the optical proximity effect occurs, by using a different thickness of phase shifting material in at least part of the isolated pattern area than in at least part of the dense pattern area, so that difference in size of a resist for a given pattern element size in the mask does not occur between the dense pattern area and the isolated pattern area due to the optical proximity effect, when both dense and isolated patterns are transferred to the resist.

2. A half tone mask, comprising:

a half tone film formed on a transparent substrate for shifting phase of transmission light so as to sharpen a curve of light intensity distribution in exposure, wherein:

a phase difference between (i) transmission light through a film section where the half tone film is formed and (ii) transmission light through an opening section where the transparent substrate is exposed varies according to patterns transferred to a resist.

3. The half tone mask as set forth in claim 2, wherein: the half tone film is made of Molybdenum Silicide, Zircon Silicide or Tantalic Silicide.

4. A half tone mask, comprising:

a half tone film formed on a transparent substrate for shifting phase of transmission light so as to sharpen a curve of light intensity distribution in exposure, wherein:

a phase difference between (i) transmission light through a film section where the half tone film is formed and (ii) transmission light through an opening section where the transparent substrate is exposed and the half tone film is not formed, respectively differ in a dense pattern area where optical proximity effect occurs and in an isolated pattern area, the phase difference in the isolated pattern area being adjusted so that difference in size of a resist for a given pattern element size in the mask does not occur between the dense pattern area and the isolated pattern area due to the optical proximity effect.

5. The half tone mask as set forth in claim 4, wherein: the half tone film is made of molybdenum suicide, zircon suicide or tantalic suicide.

6. A half tone mask, comprising:

a half tone film formed on a transparent substrate for shifting phase of transmission light so as to sharpen a curve of light intensity distribution in exposure, wherein:

a thickness of the half tone film in a dense pattern area where optical proximity effect occurs differs from that in an isolated pattern area where the optical proximity effect does not occur, the thickness of the half tone film in the isolated pattern area being adjusted so that difference in size of a resist does not occur for a given pattern element size in the mask between the dense pattern area and the isolated pattern area due to the optical proximity effect.

7. The half tone mask set forth in claim 6, wherein: a light blocking film is formed on an area not affecting a phase shifting function on the half tone film.

8. A half tone mask, comprising:

a half tone film formed on a transparent substrate for shifting phase of transmission light so as to sharpen a curve of light intensity distribution in exposure, wherein:
a substrate thickness of an opening section where the transparent substrate is exposed in a dense pattern area where optical proximity effect occurs differs from that in an isolated pattern area where the optical proximity effect does not occur, the substrate thickness of the opening section where the transparent substrate is exposed in the isolated pattern area being adjusted so that difference in size of a resist for a given pattern element size in the mask does not occur between the dense pattern area and the isolated pattern area due to the optical proximity effect.

9. A method of making a circuit board, comprising:
   (a) transferring a layout for the circuit board to a resist,
   (b) providing a half tone mask with a half tone film formed on a transparent substrate for shifting phase of transmission light so as to sharpen a curve of light intensity distribution in exposure used in the step (a), and the half tone mask causing a phase difference between (i) transmission light through a film section where the half tone film is formed and (ii) transmission light through an opening section where the transparent substrate is exposed and the half tone film is not formed to vary between different patterns transferred to a resist.

10. A method of making a circuit board, comprising:
    (a) transferring a layout for the circuit board to a resist,
    (b) providing a half tone mask with a half tone film formed on a transparent substrate for shifting phase of transmission light so as to sharpen a curve of light intensity distribution in exposure used in the step (a), and the half tone mask causing a phase difference between (i) transmission light through a film section where the half tone film is formed and (ii) transmission light through an opening section where the transparent substrate is exposed and the half tone film is not formed, to differ between a dense pattern area where optical proximity effect occurs and an isolated pattern area where the optical proximity effect does not occur, the phase difference in the isolated pattern area being adjusted so that difference in size of the resist does not occur for a given pattern element size in the mask between the dense pattern area and the isolated pattern area due to the optical proximity effect.

11. A manufacturing method of a half tone mask, comprising:
    (1) applying a resist to coat a blank mask in which a half tone film having a first film thickness is formed on a transparent substrate, and a light blocking film is formed on the half tone film;
    (2) patterning the resist thus applied in the step (1) by exposure and development into a thick film area in which the light blocking film is to be exposed, a thin film area in which the half tone film is to be exposed, and a non resist area in which the transparent substrate is to be exposed, respectively;
    (3) completely removing the light blocking film and the half tone film beneath thus exposed in the step (2) by etching;
    (4) removing the resist in the thin film area thus patterned in the step (2) by ashing, and completely removing the light blocking film formed beneath the thin film area by etching, after the step (3);
    (5) completely removing the remaining resist, and then applying a resist again, after the step (4);
    (6) patterning the resist thus applied in the step (5) by exposure and development so that a dense pattern area where optical proximity effect occurs has no resist;
    (7) carrying out etching for the half tone film thus exposed in the step (6) to have a second film thickness different than the first film thickness; and
    (8) removing the remaining resist,
    wherein:
    the first film thickness causes a phase difference between (i) transmission light through a first film section where the half tone film having the first film thickness is formed and (ii) transmission light through an opening section where the transparent substrate is exposed so that difference in size of the resist for a given pattern element size in the mask does not occur between a dense pattern area and an isolated pattern area, and
    the second film thickness causes a phase difference of about 180° between the (i) transmission light through a second film section where the half tone film having the second film thickness is formed and the (ii) transmission light through the opening section where the transparent substrate is exposed.

12. A manufacturing method of a half tone mask, comprising:
    (1) applying a resist to coat a blank mask in which a half tone film having a first film thickness is formed on a transparent substrate, and a light blocking film is formed on the half tone film;
    (2) patterning the resist thus applied in the step (1) into a thick film area in which the light blocking film is to be exposed, a thin film area in which the half tone film is to be exposed, and a non resist area in which the transparent substrate is to be exposed, respectively;
    (3) completely removing the light blocking film and the half tone film beneath thus exposed in the step (2);
    (4) removing the resist in the thin film area thus patterned in the step (2), and completely removing the light blocking film formed beneath the thin film area, after the step (3);
    (5) completely removing the remaining resist, and then applying a resist again, after the step (4);
    (6) patterning the resist thus applied in the step (5) so that a dense pattern area where optical proximity effect occurs has no resist;
    (7) processing the half tone film thus exposed in the step (6) to have a second film thickness different than the first film thickness; and
    (8) removing the remaining resist,
    wherein:
    the first film thickness causes a phase difference between (i) transmission light through a first film section where the half tone film having the first film thickness is formed and (ii) transmission light through an opening section where the transparent substrate is exposed, so that difference in size of the resist does not occur for a given pattern element size in the mask between a dense pattern area and an isolated pattern area due to optical proximity effect, and
    the second film thickness causes a phase difference of about 180° between the (i) transmission light through a second film section where the half tone film having the second film thickness is formed and the (ii) transmission light through the opening section where the transparent substrate is exposed.

13. A manufacturing method of a half tone mask, comprising:

(A) applying a resist to coat a blank mask in which a half tone film having a predetermined thickness is formed on a transparent substrate having a first substrate thickness;

(B) patterning the resist thus applied in the step (A) by exposure and development so that an area where the transparent substrate is exposed has no resist;

(C) completely removing the half tone film thus exposed in the step (B) by etching;

(D) completely removing the remaining resist, and then applying a resist again, after the step (C);

(E) patterning the resist thus applied in the step (D) by exposure and development so that an isolated pattern area where optical proximity effect does not occur has no resist;

(F) digging the transparent substrate thus exposed in the step (E) to have a second substrate thickness; and (G) removing the remaining resist, wherein:

the first substrate thickness causes a phase difference of about 180° between (i) transmission light through an opening section where the transparent substrate is exposed having the first substrate thickness and (ii) transmission light through a film section where the half tone film is formed, and the second substrate thickness causes a phase difference between (iii) transmission light through the opening section where the transparent substrate in exposed having the second substrate thickness and the (ii) transmission light through the film section where the half tone film is formed, so that difference in size of the resist does not occur for a given pattern element size in the mask between a dense pattern area and an isolated pattern area.

14. A manufacturing method of a half tone mask, comprising the steps of:

(A) applying a resist to coat a blank mask in which a half tone film having a predetermined thickness is formed on a transparent substrate having a first substrate thickness;

(B) patterning the resist thus applied in the step (A) so that an area where the transparent substrate is exposed has no resist;

(C) completely removing the half tone film thus exposed in the step (B);

(D) completely removing the remaining resist, and then applying a resist again, after the step (C);

(E) patterning the resist thus applied in the step (D) so that an isolated pattern area where optical proximity effect does not occur has no resist;

(F) digging the transparent substrate thus exposed in the step (E) to have a second substrate thickness; and (G) removing the remaining resist, wherein:

the first substrate thickness causes a phase difference of about 180° between (i) transmission light through an opening section where the transparent substrate is exposed having the first substrate thickness and (ii) transmission light through a film section where the half tone film is formed, and the second substrate thickness causes a phase difference between (iii) transmission light through the opening section where the half tone film is not formed and where the substrate has the second substrate thickness and the (ii) transmission light through the film section where the half tone film is formed, so that difference in size of the resist does not occur for a given pattern element size in the mask between a dense pattern area and an isolated pattern area.

15. A phase shifting mask, comprising:

a phase shifting film supported by a transparent substrate for shifting phase of transmission light; and wherein the phase shifting film has a first thickness in at least part of a dense pattern area, and a second thickness in at least part of a less dense pattern area, so that light transmitted through the mask in respective areas where the phase shifting film is present realizes a different phase shift amount in said at least part of the dense pattern area compared to said at least part of the less dense patter area.

16. The mask of claim 15, wherein the first thickness of the phase shifting film causes a phase shift of about 180° degrees, and the second thickness of the phase shifting film causes a different phase shift amount.

17. The mask of claim 15, wherein the thickness of the phase shifting film is adjusted so that difference in size of a resist does not occur for a given pattern element size in the mask between the dense pattern area and the less dense pattern area due to optical proximity effect.

18. A method of making a device including a circuit board, the method comprising:

(a) transferring a layout for the circuit board to a resist, and (b) providing a mask with a phase shifting film supported by a transparent substrate for shifting phase of transmission light used in step (a), and the mask having a phase shift film with different thicknesses in a dense pattern area and a less dense pattern area thereby causing a phase difference between (i) transmission light through a film section where the phase shift film is formed and (ii) transmission light through an opening section where the phase shift film is not formed to vary between the dense pattern area and the less dense pattern area.

* * * * *